United States Patent
Schmitt et al.

(10) Patent No.: US 11,175,353 B2
(45) Date of Patent: Nov. 16, 2021

(54) POSITION SENSOR WITH COMPENSATION FOR MAGNET MOVEMENT AND RELATED POSITION SENSING METHOD

(71) Applicant: ANALOG DEVICES INTERNATIONAL UNLIMITED COMPANY, Limerick (IE)

(72) Inventors: Jochen Schmitt, Biedenkopf (DE); Eoin Edward English, Pallasgreen (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/277,130

(22) Filed: Feb. 15, 2019

(65) Prior Publication Data

US 2019/0257894 A1 Aug. 22, 2019

Related U.S. Application Data

(60) Provisional application No. 62/761,252, filed on Feb. 16, 2018.

(51) Int. Cl.
*G01R 33/00* (2006.01)
*G01R 33/09* (2006.01)
(Continued)

(52) U.S. Cl.
CPC ......... *G01R 33/0017* (2013.01); *G01B 7/003* (2013.01); *G01D 5/12* (2013.01); *G01R 33/09* (2013.01)

(58) Field of Classification Search
CPC .......... G01B 7/003; G01D 5/145; G01D 5/12; G01R 33/0017; G01R 33/09
See application file for complete search history.

(56) References Cited

U.S. PATENT DOCUMENTS 5,247,278 A 9/1993 Pant
5,477,143 A 12/1995 Wu
(Continued)

FOREIGN PATENT DOCUMENTS

CN 101568847 10/2009
DE 198 39 450 A1 3/2000
(Continued)

OTHER PUBLICATIONS

Search Report dated Aug. 16, 2019 for German Application No. 202019100886.5.
(Continued)

*Primary Examiner* — Jay Patidar
(74) *Attorney, Agent, or Firm* — Knobbe, Martens, Olson & Bear, LLP

(57) ABSTRACT

The disclosure provides a magneto resistive field sensor for detecting position in a particular direction. The sensor includes a plurality of magneto resistive elements arranged in pairs. The elements of the same pair are arranged so that their sensitivity direction is oriented in the same direction. The elements of different pairs are oriented so that their sensitivity direction is oriented in a different direction, preferably substantially perpendicular to another pair. The magneto resistive sensors and their sensitivity directions are generally arranged in a plane, which is perpendicular to the direction of measurement of the device. The elements of each pair are arranged in series between two nodes so as to form a bridge circuit. As such, movement of the magnet in the first plane causes a substantially equal change in the elements of each pair, thereby compensating for this movement in the output signal.

19 Claims, 12 Drawing Sheets

(51) Int. Cl.
*G01B 7/00* (2006.01)
*G01D 5/12* (2006.01)

(56) References Cited

U.S. PATENT DOCUMENTS

| | | | |
|---|---|---|---|
| 5,621,320 A | 4/1997 | Yokotani et al. | |
| 5,796,249 A | 8/1998 | Andra et al. | |
| 6,069,476 A | 5/2000 | Vieux-Rochaz et al. | |
| 6,396,259 B1 | 5/2002 | Washeleski | |
| 6,686,733 B2 | 2/2004 | Muth | |
| 6,806,702 B2 | 10/2004 | Lamb et al. | |
| 6,956,366 B2 | 10/2005 | Butzmann | |
| 7,126,327 B1 | 10/2006 | Busch | |
| 7,208,940 B2 | 4/2007 | Withanawasam et al. | |
| 7,425,824 B2 | 9/2008 | Busch | |
| 7,490,522 B2 | 2/2009 | Ruehrig et al. | |
| 7,818,890 B2 | 10/2010 | Duric et al. | |
| 8,102,172 B2 * | 1/2012 | Takeya | B82Y 25/00 324/207.21 |
| 9,018,946 B2 | 4/2015 | Paci et al. | |
| 9,080,986 B2 | 7/2015 | Wallrafen | |
| 9,222,993 B2 | 12/2015 | Musha et al. | |
| 9,719,806 B2 | 8/2017 | Foletto et al. | |
| 2006/0087318 A1 | 4/2006 | Crolly et al. | |
| 2007/0145972 A1 * | 6/2007 | Auburger | G01R 33/06 324/252 |
| 2008/0224692 A1 | 9/2008 | Baak | |
| 2009/0315543 A1 | 12/2009 | Guo et al. | |
| 2010/0001723 A1 * | 1/2010 | Van Zon | G01R 33/09 324/252 |
| 2011/0037459 A1 * | 2/2011 | Okada | G01D 5/145 324/207.25 |
| 2014/0232379 A1 | 8/2014 | Nazarian et al. | |
| 2015/0185297 A1 | 7/2015 | Zimmer et al. | |
| 2015/0192432 A1 * | 7/2015 | Noguchi | G01R 33/09 324/207.2 |
| 2015/0192433 A1 * | 7/2015 | Onodera | G01D 5/145 324/207.21 |
| 2017/0210247 A1 | 7/2017 | Rao | |

FOREIGN PATENT DOCUMENTS

| | | |
|---|---|---|
| DE | 10 2004 032 484 B3 | 11/2005 |
| DE | 10 2009 042 473 A1 | 4/2011 |
| DE | 10 2017 211 994 A1 | 1/2019 |
| JP | U04-21812 | 7/1990 |
| JP | H11513128 | 11/1999 |
| JP | 2006527357 A * | 11/2006 |
| JP | 2008-525787 | 7/2008 |
| WO | WO2006/070305 | 7/2006 |
| WO | WO 2018/177762 | 10/2018 |

OTHER PUBLICATIONS

Office Action issued in Application No. JP 2019-026428 dated Apr. 20, 2020.

Honeywell, "AN211 Application Note: Applications of Magnetic Position Sensors," 8 pages, 01-02 Rev. Available at: https://aerocontent.honeywell.com/aero/common/documents/Applications-of-Magnetic-Position-Sensors.pdf (accessed: Mar. 21, 2019).

Office Action issued in Taiwan Application No. 108105276 dated Oct. 12, 2020.

Office Action for Japanese Patent Application No. 2019-026428 dated Dec. 7, 2020.

* cited by examiner

POSITION SENSOR WITH COMPENSATION FOR MAGNET MOVEMENT AND RELATED POSITION SENSING METHOD

CROSS-REFERENCE TO PRIORITY APPLICATION

This application claims the benefit of priority under 35 U.S.C. § 119(e) of U.S. Provisional Patent Application No. 62/761,252, filed Feb. 16, 2018, titled "POSITION SENSOR AND POSITION SENSING METHOD," the disclosure of which is hereby incorporated by reference in its entirety.

FIELD OF THE DISCLOSURE

The present disclosure relates to a position sensor which compensates for movement of sensor components in any direction which is not aligned with the direction of detection. The present disclosure also relates to a corresponding method of sensing position.

BACKGROUND

Position sensors are typically constructed using a simple magnet and a field sensor. As the magnet moves in relation to the field sensor, the field sensor produces an output signal indicative of the degree of movement. Such position sensors are simple to manufacture and are typically produced in high volumes. The distance between the magnet and the field sensor correlates with the magnetic field strength at the sensor.

While this type of sensor is simple to manufacture and inexpensive, they are highly sensitive to stray fields and misalignment of the magnet. For example, movement of the magnet in a direction perpendicular to the intended movement of travel will change the field strength at the field sensor, thereby affecting the position measurement.

SUMMARY OF THE DISCLOSURE

The disclosure provides a magnetoresistive field sensor for detecting position in a particular direction. The sensor includes a plurality of magnetoresistive elements arranged in pairs. The elements of the same pair are arranged so that their sensitivity direction is oriented in the same direction. The elements of different pairs are oriented so that their sensitivity direction is oriented in a different direction, preferably substantially perpendicular to another pair. The magnetoresistive sensors and their sensitivity directions are generally arranged in a plane, which is perpendicular to the direction of measurement of the device. The elements of each pair are arranged in series between two nodes so as to form a bridge circuit. As such, movement of the magnet in the first plane causes a substantially equal change in the elements of each pair, thereby compensating for this movement in the output signal.

In accordance with a first aspect, a magnetoresistive position sensor for measuring position in at least a first direction is provided, the sensor comprising a magnet arranged to move in at least the first direction, and a differential field sensor arranged to detect movement of the magnet in a first direction, and to compensate for movement of the magnet in at least a second direction.

As such, the sensor is configured to measure movement of a magnet in one particular direction, that is, the direction of detection, whilst movement of the magnet in the at least a second direction is compensated for by the differential field sensor. That is to say, the sensor compensates for movement by the magnet in a different direction such that any movement in this other direction does not affect the measurement of the magnet's movement in the direction of detection. For example, the magnet may be suspended above the sensor and configured to move towards and away from the sensor in the z direction, the sensor measuring the change in magnetic field strength as it moves in this direction. The differential field sensor may then be configured to compensate for changes in the field strength resulting from any lateral movement by the magnet as it moves in the direction of detection.

The differential field sensor may comprise a plurality of magnetoresistive elements. For example, the magnetoresistive elements may be giant magnetoresistive (GMR) spin valves, tunnelling magnetoresistive (TMR) elements, anisotropic magnetoresistive elements (AMR), or any other suitable magnetoresistive device which is sensitive to changes in magnetic field in a particular direction.

Each of the plurality magnetoresistive elements may have a sensing direction, and at least a first pair of the elements may be arranged such that their sensing directions are aligned. The sensing direction of the plurality of magnetoresistive elements may be arranged in a first plane, and the first plane may be off set with respect to the first direction. For example, the first plane may be substantially perpendicular to the first direction. The at least a second direction may be in the first plane.

By aligning the sensing directions of pairs of magnetoresistive elements, movement by the magnet in the direction of the sensing direction will result in a similar or identical change in resistance, the pairs of magnetoresistive elements being connected in such a way that this will result in a zero or substantially zero change to the sensor output. Therefore, by aligning the sensing directions in one particular plane, any movement in that plane can be compensated for.

The sensor may further comprise a second pair of the magnetoresistive elements that are arranged such that their sensing directions are aligned, and such that their sensing directions are offset with respect to the first pair of the magnetoresistive elements. The sensing direction of the first pair of the magnetoresistive elements may be substantially perpendicular to the sensing direction of the second pair of the magnetoresistive elements.

For example, in the case where the direction of detection is the z direction, the sensing directions of the magnetoresistive elements may be arranged in the x-y plane. One pair of the magnetoresistive elements may have their sensing directions aligned in the x direction to compensate for movement in that direction, whilst another pair of the magnetoresistive elements may have their sensing directions aligned in the y direction to compensate for movement in that direction.

The plurality of magnetoresistive elements may be arranged in a first plane such that the at least first and second pairs are evenly distributed around the sensor, each respective element of a pair of the magnetoresistive elements being disposed on an opposing side of the sensor and at an equidistant position relative to the magnet. For example, each pair of the magnetoresistive elements may be arranged at opposing corners of the sensor, or they may be arranged at the centre of opposing edges of the sensor.

The plurality of magnetoresistive elements may be connected in a bridge arrangement, and an output of the bridge may be indicative of movement of the magnet in the first direction. For example, the bridge arrangement may be a Wheatstone bridge circuit.

The at least a second direction may be in a first plane, substantially perpendicular to the first direction, wherein the output of the bridge arrangement is not indicative of movement of the magnet in the first plane. As such, the output of the bridge arrangement may only provide an indication of movement in the first direction, whilst the differential field sensor is configured to compensate for any movement in the first plane. That is to say, the differential field sensor is configured so that any movement of the magnet in the first plane results in zero or substantially zero change in the output. As such, the output is independent of movement in the first plane insofar that it is substantially unaffected by any changes in magnetic field strength caused by lateral movement of the magnet within the first plane.

In some arrangements, a first pair of magnetoresistive elements may be connected in series between a first node and a second node, and a second pair of elements are connected in series between the first node and the second node, and an output of the bridge circuit is taken from a node between each pair.

In such cases, each of the plurality magnetoresistive elements may have a sensing direction. The first pair of the magnetoresistive elements may be arranged such that their sensing directions are aligned, and the second pair of the magnetoresistive elements may be arranged such that their sensing directions are aligned, wherein the sensing directions of the second pair of magnetoresistive elements are offset with respect to the sensing directions of the first pair of the magnetoresistive elements. For example, the sensing direction of the first pair of the magnetoresistive elements may be substantially perpendicular to the sensing direction of the second pair of the magnetoresistive elements.

One of the plurality of magnetoresistive elements may be reference resistance. In some arrangements, the reference resistance may be shielded, such that its output is not magnetic-field dependent.

According to a further aspect, a method for measuring position is provided, in at least a first direction, using a magnetoresistive position sensor, the method comprising detecting a position of a magnet, in a first direction, using a differential field sensor, and compensating for movement of the magnet in at least a second direction, using the differential field sensor.

The at least a second direction may be in a first plane, the first plane being substantially perpendicular to the first direction.

In accordance with a third aspect, a position sensor arranged to carry out the method of the second aspect is provided.

In accordance with a fourth aspect, a sensor a magnetoresistive position sensor for measuring position in at least a first direction is provided, the sensor comprising a magnet arranged to move in at least the first direction, and a substrate having a plurality of magnetoresistive elements arranged thereon, the magnetoresistive elements arranged to detect movement of the magnet in a first direction, wherein the magnetoresistive elements are arranged in a bridge arrangement to compensate for movement of the magnet in at least a second direction.

BRIEF DESCRIPTION OF THE DRAWINGS

The present disclosure will now be described by way of example only with reference to the accompanying drawings in which.

DETAILED DESCRIPTION

Figure 1:
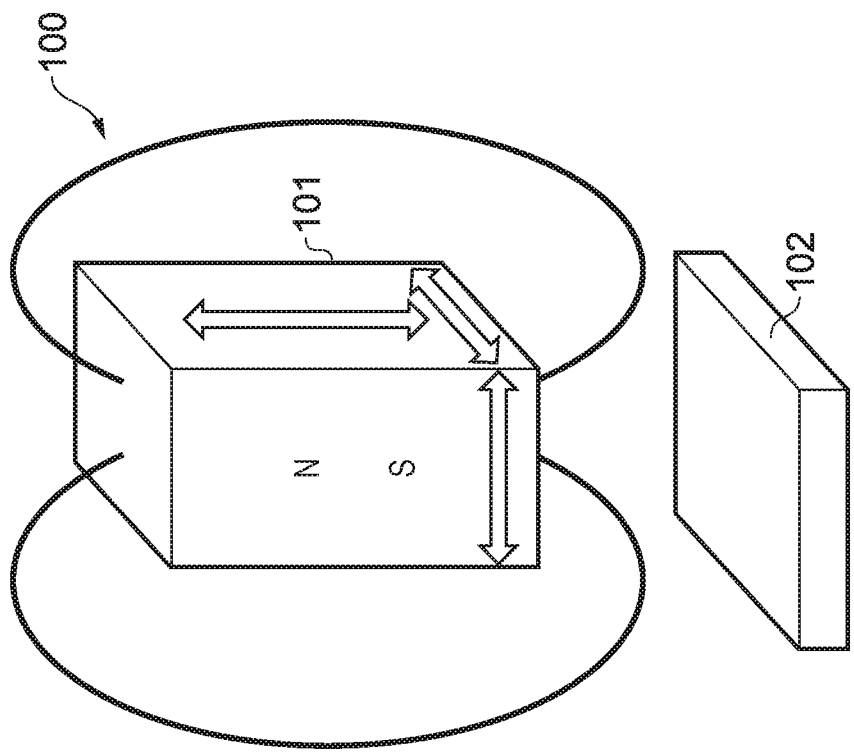
FIG. 1 is a schematic perspective view of a sensor in accordance with an embodiment of the disclosure.

A position sensor typically includes a magnet suspended above a sensing element. The magnet produces a magnetic field and the sensing element measures the magnetic field strength. The magnet may be suspended such that it can move back and forth in relation to the sensing element. For example, it may be suspended using metal connections which act as springs. When the magnet moves closer to the sensing element, there is a corresponding increase in the magnetic field strength at the sensing element. Conversely, when the magnet moves away from the sensing element, there is a corresponding decrease in the magnetic field strength at the sensing element. As such, the output of the sensing element is a measure of magnetic field strength. This represents the distance between the magnet and the sensing element. As an example, the sensing element may be a Hall effect sensor or a magnetoresistive device, such as a giant magnetoresistive (GMR) sensor.

Position sensors are manufactured so that the magnet should only able to move in the direction for which position detection is required. This is generally denoted as the z-direction. However, it is not always possible to completely prevent the magnet moving from side to side in the x-y plane, that is to say, moving in a plane perpendicular to the direction of detection. The magnetic field generated by a magnet varies not only with distance from an end of the magnet in the z-direction, but also from side to side in the x-y plane. As such, any lateral movement of the magnet from side to side may generate a change in output at the sensing element. This could be misinterpreted as a movement in the primary direction of travel, giving false position readings. Furthermore, if the sensor moves within close proximity of another device which generates magnetic fields, the sensing element may detect these fields. This may be misinterpreted as movement of the device in the primary direction.

In an embodiment of the disclosure, the sensor is provided with pairs of sensing elements, which are arranged to compensate for changes in the magnetic field due to movement in the x-y plane, or due to external magnetic fields. This is achieved using pairs of magnetoresistive elements which may be connected together in a Wheatstone bridge arrangement. Each element of each pair of elements is positioned on opposite sides of, and equidistant from, the magnet. The magnetic field strength on either side of the magnet is generally equal, but in opposite directions. The magnetoresistive sensing elements are arranged such that the elements of each pair have their sensing directions, that is, their sensitivity, aligned and in the same direction. As such, one of the elements will have a very high electrical resistance, and the other will have a lower electrical resistance when the magnet is centred in the x-y plane. As the magnet moves within the x-y plane in the direction of the sensing direction, both elements of the pair will experience a similar or an identical change in electrical resistance. As such, the potential divider ratio at, and hence the output of the Wheatstone bridge will remain the same or substantially the same.

By arranging two pairs of elements, having sensing directions perpendicular to each other within the x-y plane, and evenly distributed around the magnet, movement of the magnet within the x-y plane is largely compensated for. Furthermore, application of a uniform external magnetic field, for example from an external device, will have no, or minimal effect on the output of the Wheatstone bridge.

FIG. 1 shows a schematic perspective view of a position sensor 100 in accordance with an embodiment of this disclosure. As shown in FIG. 1, the sensor includes a magnet 101 and a sensing element 102. The magnet 101 is suspended above the sensing element 102 and is arranged to move in a primary direction. In this example, the primary direction is the z-direction, and as such the magnet is arranged to move away from and towards the sensing element 102. However, the magnet is also able to move to a small degree in the x-y plane. This is because as it very difficult to suspend the magnet in such a way that there is no movement in the x-y plane, while allowing for movement in the z-direction. For example, the magnet may be supported by metal sheet connectors which attach the magnet to the sensor. The metal connectors act like springs, thereby allowing z-direction movement. However, as they are spring-like, a small amount of movement in the x-y plane may occur.

Figure 2:
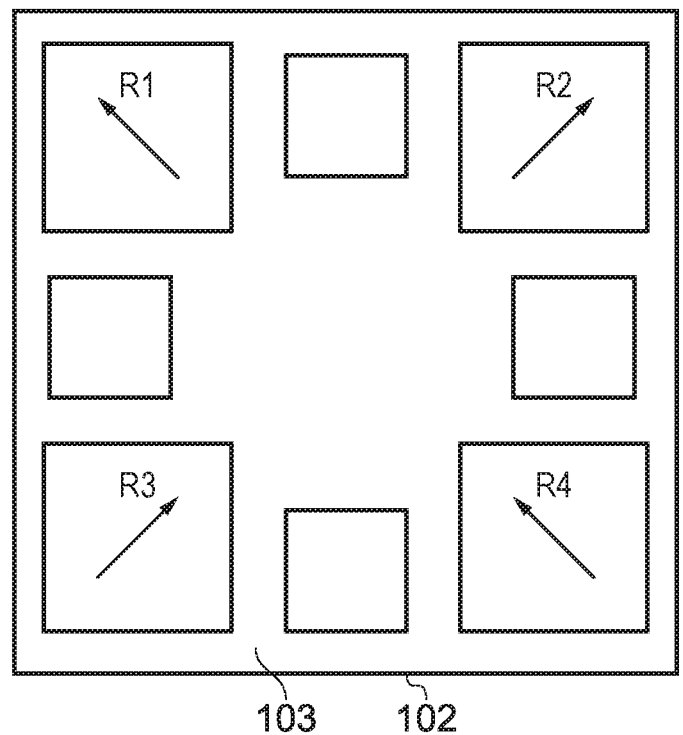
FIG. 2 is a plan view of a sensing element of the sensor of FIG. 1.

FIG. 2 shows a plan view of the sensing element 102 shown in FIG. 1. In this example, the sensing element 102 includes a substrate 103 which may be formed from silicon or glass. The substrate has four magnetoresistive elements R1, R2, R3 and R4 formed on an upper surface of the substrate 103. The magnetoresistive elements are thin film devices, which may be formed using standard semiconductor manufacturing processes. In this example, the magnetoresistive devices are giant magnetoresistive (GMR) spin valves. However, the magnetoresistive elements may be tunnelling magnetoresistive (TMR) elements or anisotropic magnetoresistive elements (AMR). Generically, these devices may be referred to as xMR elements. In further embodiments, any type of magnetoresistive device which is sensitive to changes in magnetic field in a particular direction may be used.

In this example, each magnetoresistive element R1-R4 may be formed towards a respective corner of the square-shaped substrate. In this example, the magnetoresistive elements at opposing corners of the sensing element 102 are arranged to have their directions of sensitivity aligned. As such, elements R1 and R4 have their directions of sensitivity aligned, and elements R2 and R3 have their directions of sensitivity aligned. The direction of sensitivity of elements R2 and R3 is arranged such that it is perpendicular to the direction of sensitivity of elements R1 and R4. It will be understood however that other arrangements are possible. For example, each of the magnetoresistive elements R1-R4 may be formed towards the centre of an edge of the substrate.

In a further embodiment, the sensing element may include more than two pairs of magnetoresistive elements. The greater the number of pairs of elements the better the sensor will be at compensating for movement of the magnet in the x-y plane. For any given number of pairs of magnetoresistive elements, the direction of sensitivity of the pairs may be equally distributed around 360 degrees. That is to say, the pairs of magnetoresistive elements may be evenly distributed around the plane in which movement is to be compensated for, with each pair being positioned on opposite sides of, and equidistant from, the magnet.

Figure 3:
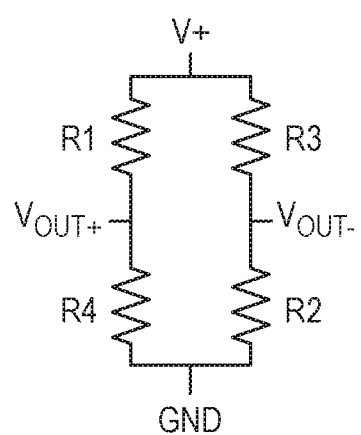
FIG. 3 is a bridge circuit in accordance with an embodiment of the disclosure.

FIG. 3 is a circuit diagram which shows the manner in which the magnetoresistive elements R1 to R4 may be connected in a bridge arrangement in order to detect changes in magnetic field. In this example, elements R1 and R4 may be connected in series between a first node and second node. The first node is coupled to a first supply rail and the second node is connected to a second supply rail or ground. In a corresponding manner, elements R3 and R2 are connected in series between the first and second nodes. As such, the combination of elements R1 and R4 are connected in parallel with the combination of elements R2 and R3. The output of the bridge circuit is then taken from a third node between elements R1 and R4, and a fourth node between elements R2 and R3. Changes in the resistance of the elements may cause changes in the output thereby providing an indication of the movement of the magnet in the z-direction.

Figure 4:
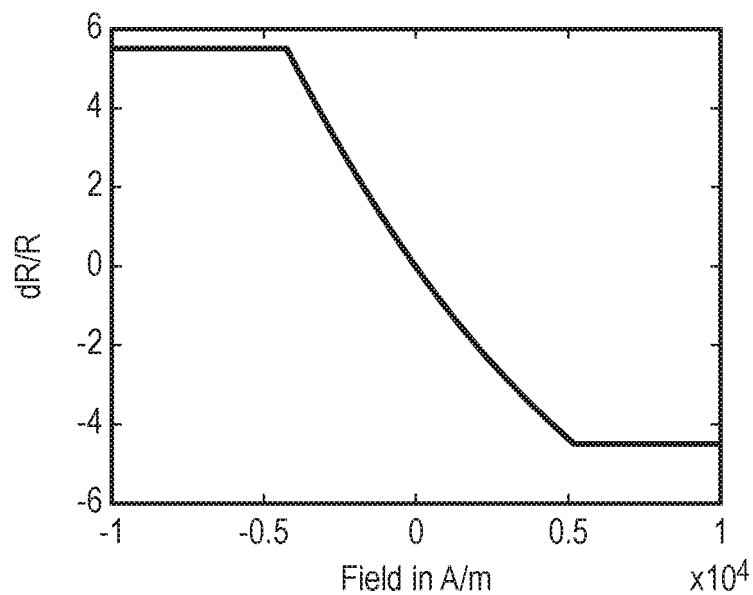
FIG. 4 is a chart showing the transfer curve of a GMR spin valve in accordance with an embodiment of the disclosure.

FIG. 4 shows a typical transfer curve for a GMR spin valve. This chart shows how the percentage change in resistance of the device changes with respect to applied magnetic field. For a high positive magnetic field, applied in the direction of sensitivity of the GMR spin valve, the resistance is low. For a high negative magnetic field, applied in the direction of sensitivity of the GMR spin valve, the resistance is high. The magnetoresistive elements of the above-described embodiment may take these characteristics.

Figure 5:
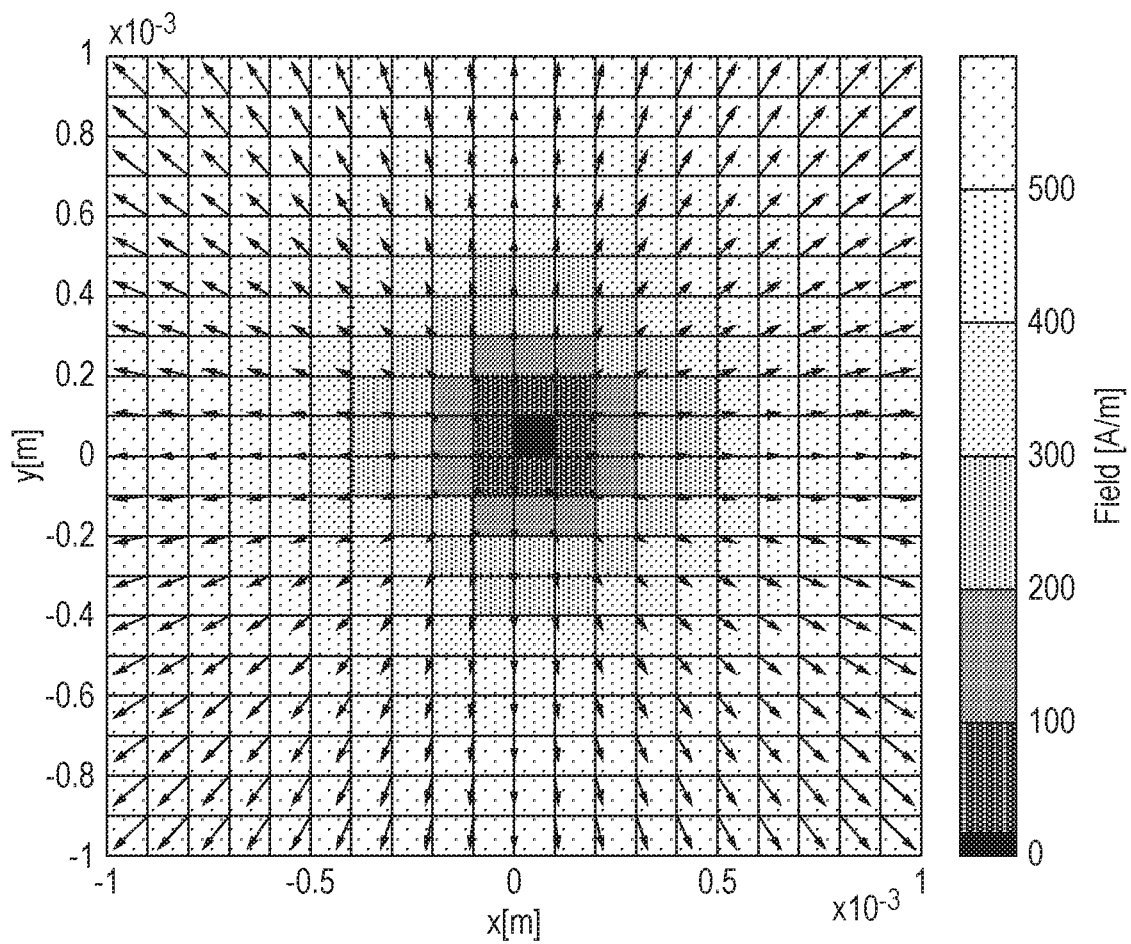
FIG. 5 is a chart showing the field strength at the surface of the sensing element of FIG. 2 when a magnet is suspended above the sensing element.

FIG. 5 shows the magnetic field in the x-y plane of the surface of the sensing element 102 when the magnet is located at a distance of 2 mm above the surface and is directly centred on the sensor surface; i.e. with no movement in the x-y plane. The chart shows the in-plane components (Hx and Hy) but excludes the out-of-plane components (Hz). The field strength is essentially zero at the very centre of the sensing element surface, whereas it is relatively strong towards the edges of the sensors.

The operation of the sensor 100 will now be described. Referring to the arrangement shown in FIG. 2, while the magnet is in a steady state, the resistance of R1 and R2 is low, as a high magnetic field is applied in the same direction as the direction of sensitivity of R1 and R2. Conversely, the resistance of R3 and R4 is high, as a high magnetic field is applied in the opposite direction to the direction of sensitivity of R3 and R4. This causes a voltage differential at the output of the bridge circuit. This voltage may be recorded as the pre-set voltage for zero movement in the z-direction.

Assuming the magnet 101 is fixed in the x-y plane, as the magnet moves away from the sensing element 102, the magnetic field strength weakens at the surface of the sensing element. As such, the resistance of elements R1 and R2 increases, as the field is orientated in the same direction as the direction of sensitivity of elements R1 and R2. Conversely, the resistance of elements R3 and R4 decreases, as the magnetic field is orientated in the opposite direction to the direction of sensitivity of elements R3 and R4. As such, the ratio of the resistance of elements R1 and R4 decreases, whereas the ratio of the resistance of elements R3 and R2 increases. As such, the output of the bridge circuit also changes. The opposite occurs when the magnet moves towards the sensing element.

Referring again to FIG. 2, the configuration of the magnetoresistive elements and the bridge circuit is such that movement of the magnet in the x-y plane has minimal, or zero impact on the output of the bridge circuit. For example, any movement of the magnet within the x-y plane in the direction of sensitivity of R1 and R4 would cause a corresponding change in the resistances of R1 and R4. For example, referring to FIG. 5, if the magnet moves laterally towards R1, the magnetic field reduces slightly, causing a slight increase in resistance. As the magnet moves towards R1, it moves away from R4. This causes a slight increase in magnetic field at R4. However, as the field is in the opposite direction to the direction of sensitivity of R4, and R4 is at a high resistance, R4 also experiences a corresponding increase in resistance. As such, the divider network of R1 and R4 does not experience any significant change in the divider ratio. The output from the bridge circuit therefore remains the same, or substantially the same. As a consequence of having two pairs of magnetoresistive elements, a similar compensation for movement in other directions within the x-y plane is achieved.

Figure 6A:
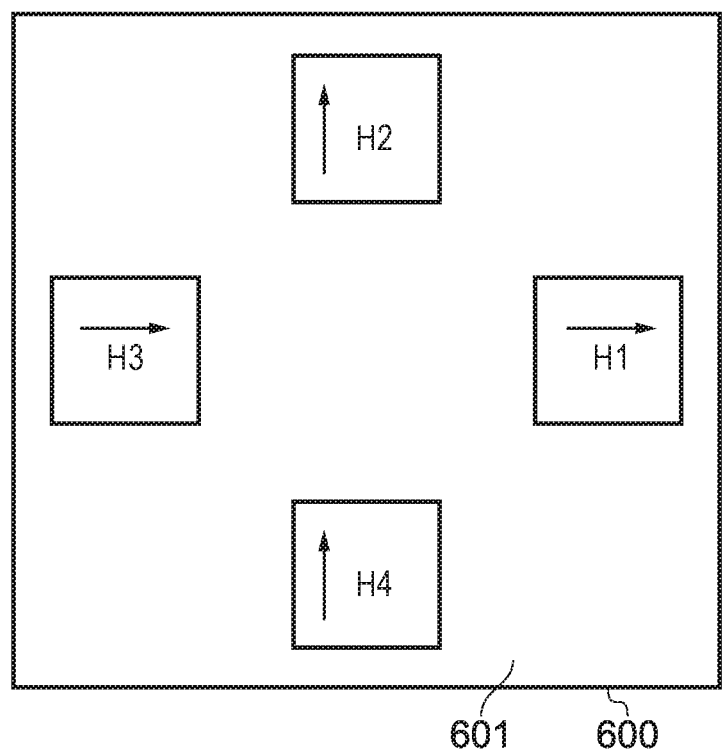
FIG. 6A is a plan view of a sensing element in accordance with a further embodiment of the disclosure.
Figure 6B:
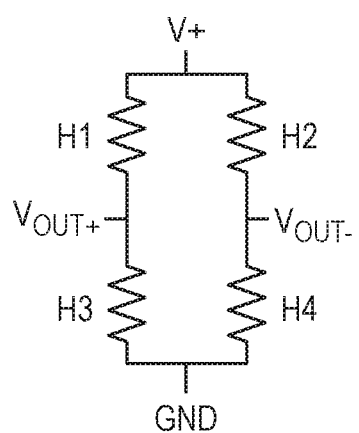
FIG. 6B is a bridge circuit in accordance with an embodiment of the disclosure.

FIG. 6A shows a sensing element 600 in accordance with a further embodiment. The sensing element 600 is the same as the element 102 shown in FIG. 2, except the magnetoresistive elements H1 to H4 are positioned along the edges of the substrate, rather than in the corners. The arrows shown in FIG. 6A correspond to the direction of sensitivity for each element. As such, in this example, the magnetoresistive elements at opposing edges of the sensing element 600 are arranged to have their directions of sensitivity aligned. Elements H1 and H3 have their directions of sensitivity aligned, and elements H2 and H4 have their directions of sensitivity aligned. The direction of sensitivity of elements H2 and H4 is arranged such that it is perpendicular to the direction of sensitivity of elements H1 and H3. In terms of the bridge circuit, H1 and H3 are connected in series on one side of the bridge, and H2 and H4 are connected in series on the other side, as shown in FIG. 6B.

When the magnet moves in the z-direction, the method of operation is essentially the same as described above in connection with FIGS. 2 and 3. While the magnet is in a steady state, the resistance of H1 and H2 is low, as a high magnetic field is applied in the same direction as the direction of sensitivity of H1 and H2. Conversely, the resistance of H3 and H4 is high, as a high magnetic field is applied in the opposite direction to the direction of sensitivity of H3 and H4. Therefore, as the magnet moves away from the sensing element 600, the magnetic field strength weakens at the surface of the sensing element, causing the resistance of elements H1 and H2 to increase, and the resistance of elements H3 and H4 to decrease. As such, the ratio of the resistance of elements H1 and H3 decreases, whereas the ratio of the resistance of elements H4 and H2 increases, resulting in a change at the output of the bridge circuit. As before, the opposite occurs when the magnet moves towards the sensing element 600.

FIGS. 7A to 7D show the magnetic field strength measurements at each individual element of sensing element 600 in order to demonstrate the manner in which sensor operates. In practice, no such measurements would be taken. FIG. 8 shows the overall output of the sensing element 600. It should be noted that the charts shown in FIGS. 7 and 8 are based on simulations in which the starting or zero position of the magnet in the z direction is approximately 2 mm from the magnet to the sensor surface. As such, the graphs shown in FIGS. 7A to 7D and 8 show the change in magnetic field strength in the z-direction as the magnet is moved away and towards the sensor, starting from this zero position.

Figure 7A:
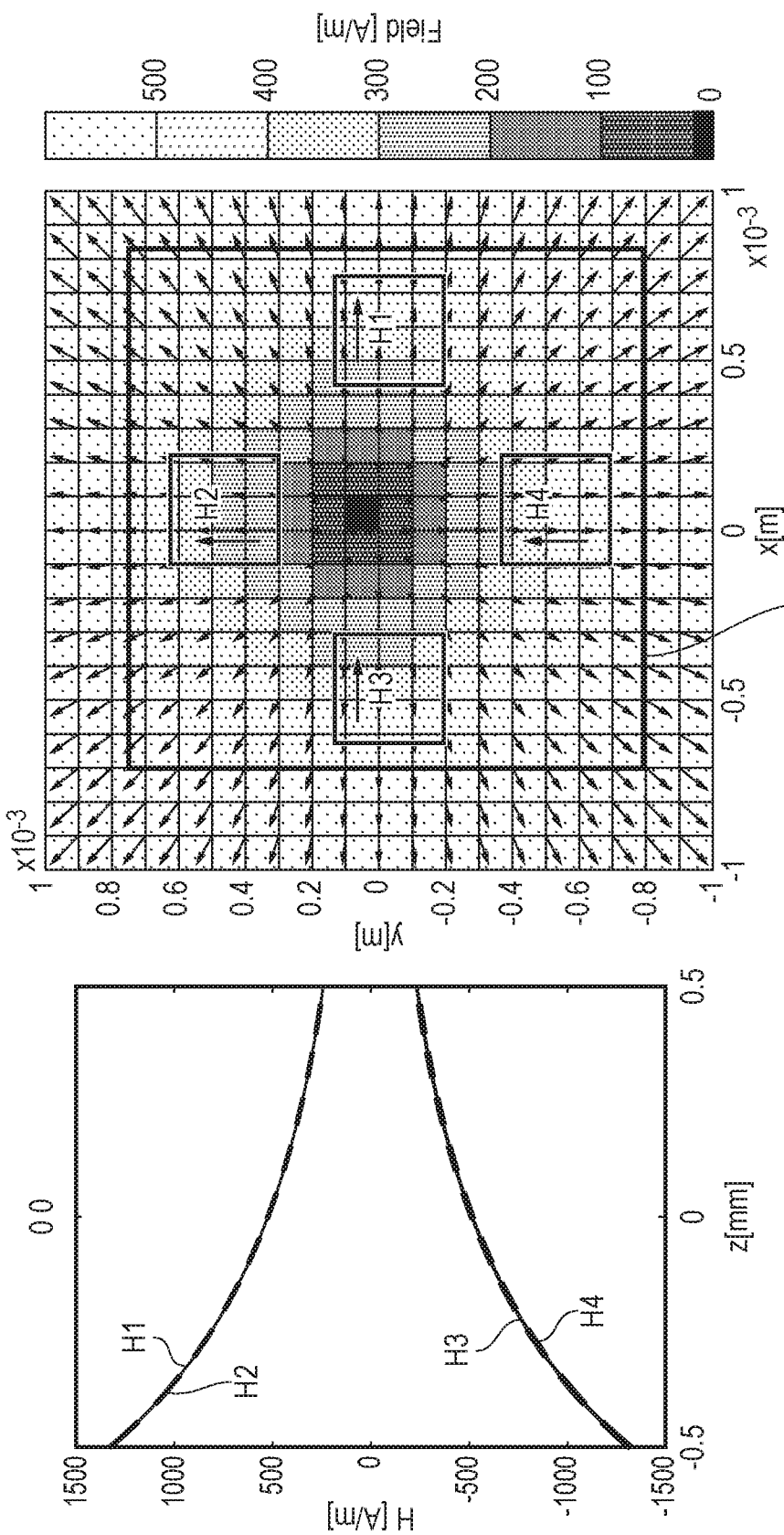
FIGS. 7A to 7D are charts showing magnetic field at each element of the sensing element of FIG. 6, and charts showing the relative position of the magnet and the sensing element.
Figure 8:
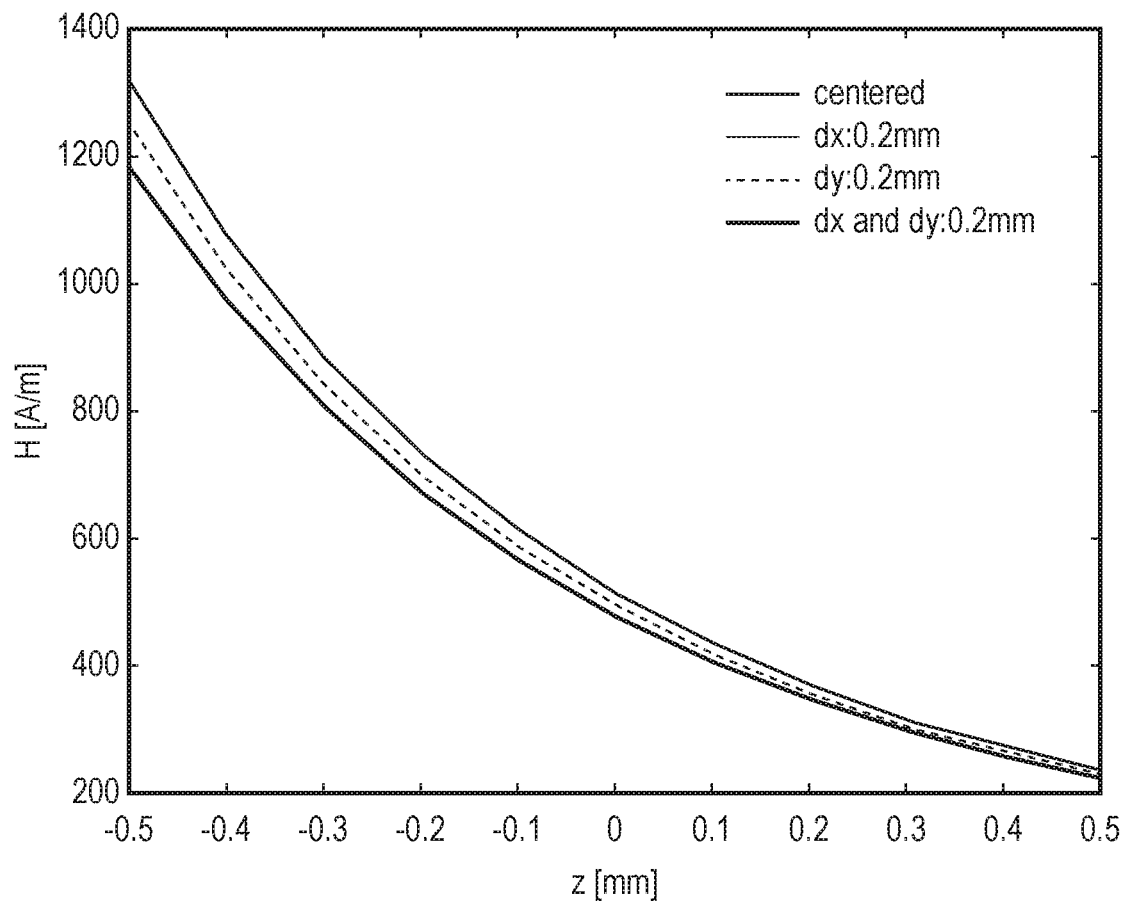
FIG. 8 is a chart showing the overall magnetic field strength against movement of the magnet in the z-direction.

FIG. 7A shows the output of each element when the magnet is centred on the sensing element. The position of the sensing element with respect to the magnet is shown on the right side of the chart. The y-axis shows the measured field strength, whereas the x-axis shows the displacement of the magnet in the z-direction in millimetres. As shown in FIG. 7A, the measured field strength at H1 and H2 are identical, regardless of the displacement of the magnet in the z-direction. The field strength measured by H3 and H4 are also identical as well as being equal and opposite to the field strength measured at H1 and H2. As such, as z increases, the field strength decreases at H1, H2, H3 and H4. As such, the output from the bridge circuit reflects only the movement in the z-direction.

Figure 7B:
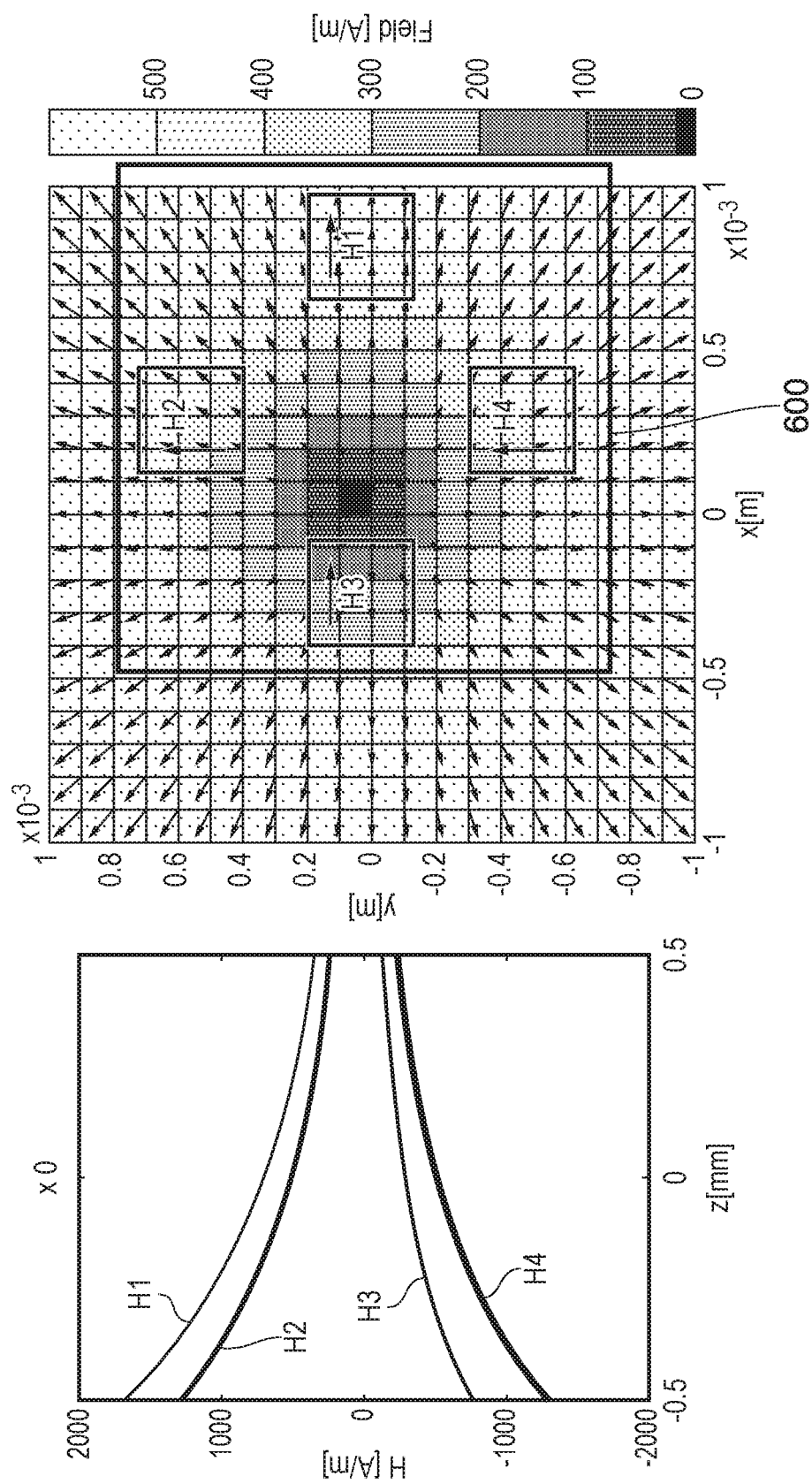

FIG. 7B shows the same arrangement when the magnet has been displaced in the x-direction (to the left in this example). As shown, the plot of H2 and the plot of H4 do not change, or change to a very small degree, as the field strength has not changed substantially in the region of elements H2 and H4. However, the plot representing H1 has moved upwards indicating an increase in field strength. The plot representing H3 has also moved upwards, representing a decrease in field strength. As such, the resistances of both H1 and H3 will have decreased. As H1 and H3 are formed in series in the bridge arrangement, the potential between the two resistances will not significantly alter. In effect, H1 and H3 compensate for movement in the x direction.

Figure 7C:
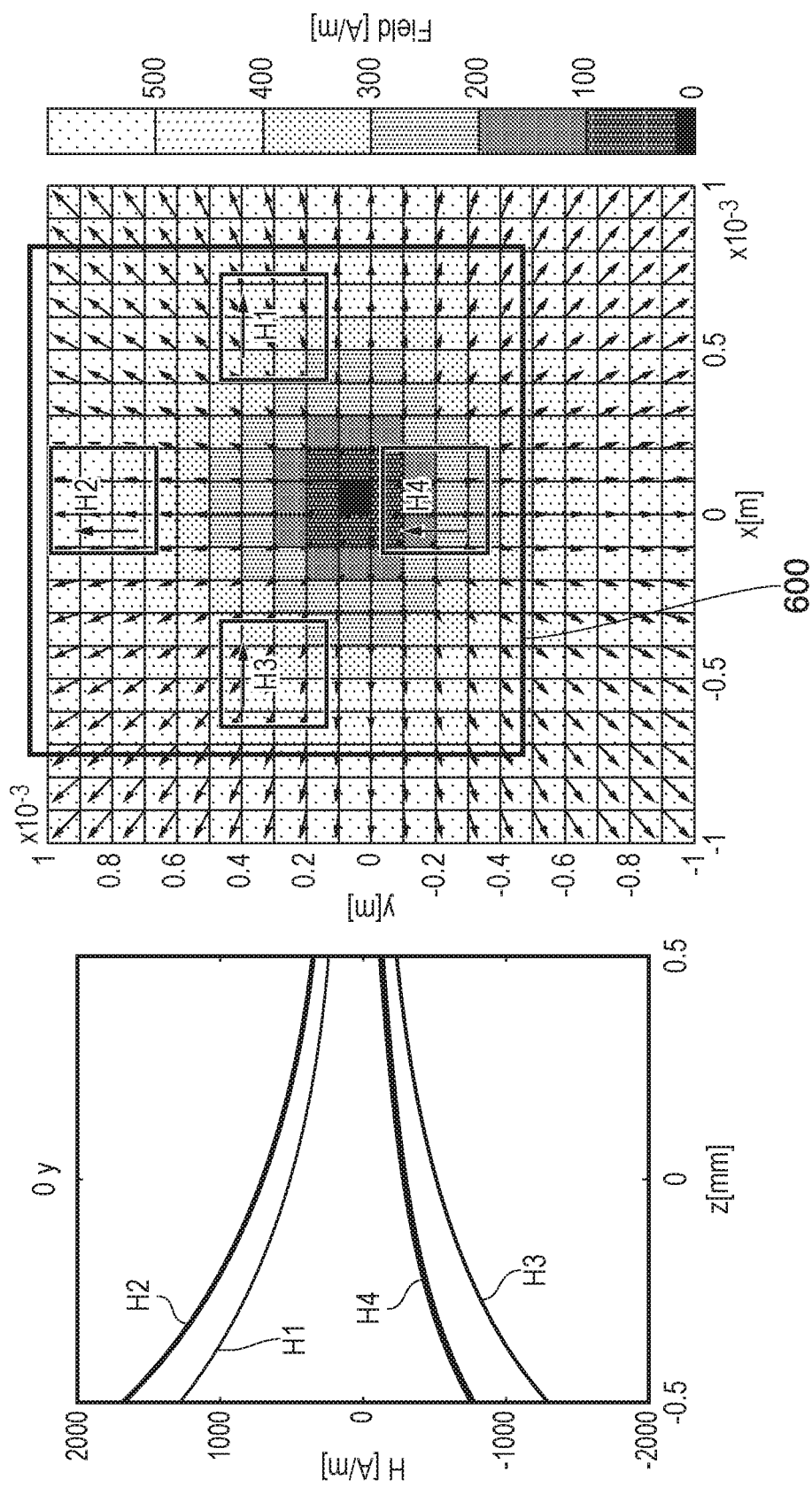

FIG. 7C shows the same arrangement when the magnet has been displaced in the y-direction (to the top in this example). As shown, the plot of H1 and the plot of H3 do not change, or change to a very small degree, as the field strength has not changed substantially in the region of elements H1 and H3. However, the plot representing H2 has moved upwards indicating an increase in field strength. The plot representing H4 has also moved upwards, representing a decrease in field strength. As such, the resistances of both H2 and H4 will have decreased. As H2 and H4 are formed in series in the bridge arrangement, the potential between the two resistances will not significantly alter. In effect, H2 and H4 compensate for movement in the y direction.

Figure 7D:
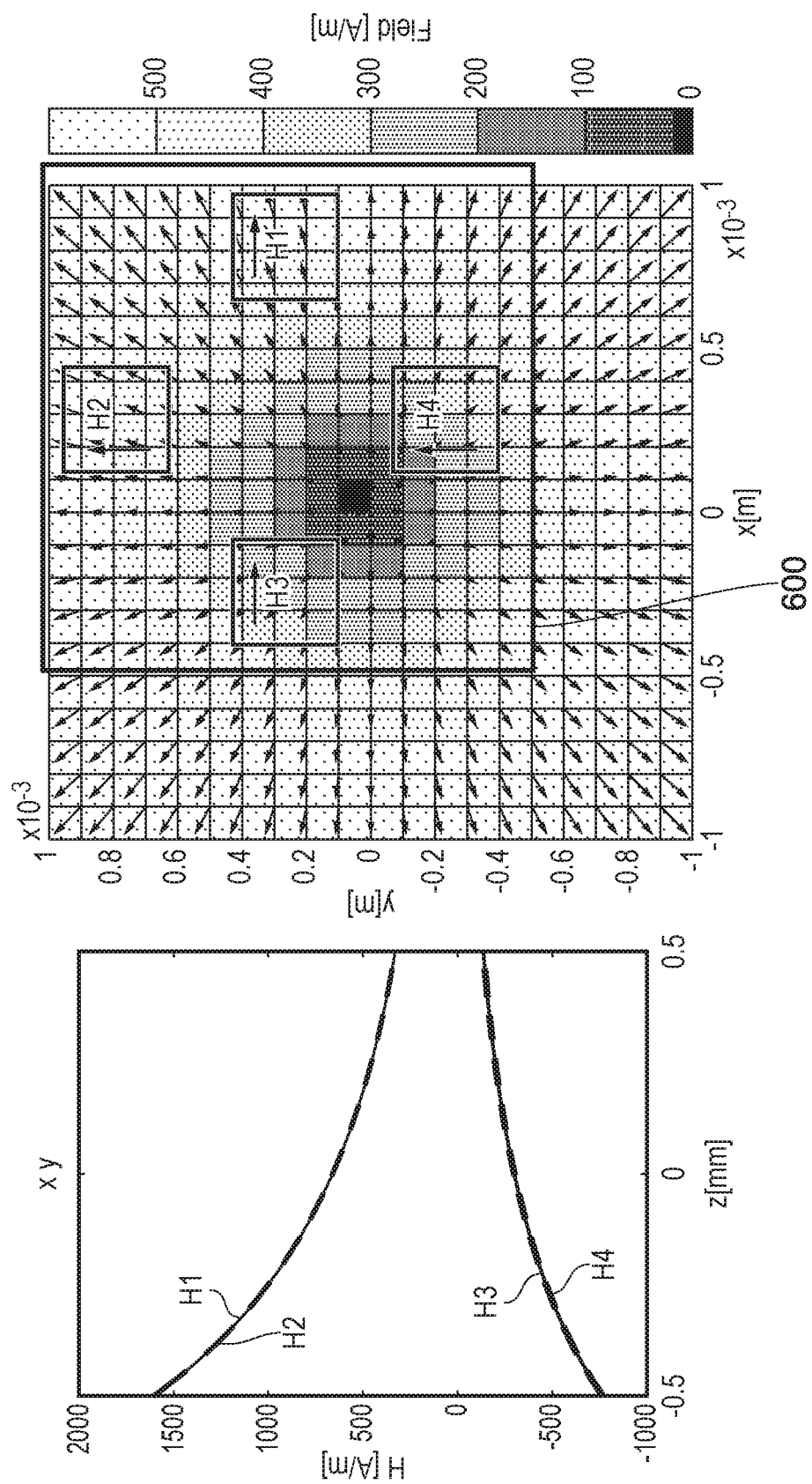

FIG. 7D shows the same arrangement when the magnet has been displaced in the x-direction and the y-direction. Here, the plot representing H1 indicates an increase in field strength in the region of element H1, whilst the plot representing H3 indicates a decrease in field strength in the region of element H3, the elements H1 and H3 thereby experiencing a corresponding decrease in resistance. Similarly, the plot representing H2 indicates an increase in field strength in the region of element H2, whilst the plot representing H4 indicates a decrease in field strength in the region of element H4. However, as the direction of sensitivity of elements H2 and H4 is perpendicular to that of elements H1 and H3, this change in field strength results in a corresponding increase in the resistance of elements H2 and H4. Consequently, the bridge output at each respective pair of elements H1 and H3, and H2 and H4, will remain the same, or substantially the same. As such, H1 and H3 compensate for the movement in the x direction, whilst H2 and H4 compensate for any movement in the y direction.

FIG. 8 is a chart showing the field strength detected by the bridge circuit against displacement of the magnet in the z-direction. In this example, the chart shows a plot when the magnet is centred, a plot when it is displaced in the x-direction by 0.2 mm, a plot when it is displaced in the y-direction by 0.2 mm and a plot when it is displaced in both the x-direction and the y-direction by 0.2 mm. While there is a small difference in the output because of x-y movement, this is largely compensated for in comparison to a single element-type detector.

Figure 9:
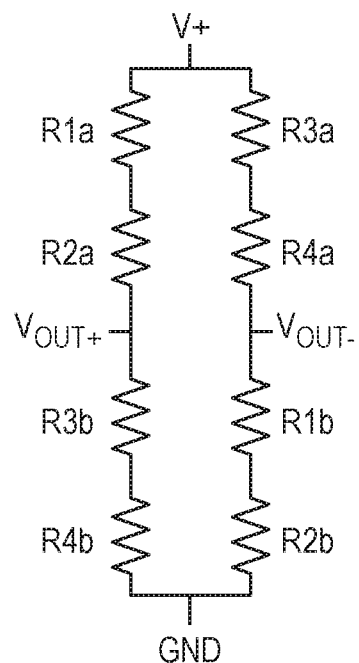
FIG. 9 is a bridge circuit in accordance with a further embodiment of the disclosure.

FIG. 9 shows a bridge circuit in accordance with an alternative embodiment. In this embodiment, R1 to R4 are each formed from two identical magnetoresistive elements R1a, R1b, R2a, R2b, R3a, R3b, R4a, and R4b. For example, R1a and R1b are formed by cutting a strip forming R1 in half. R1a and R1b are located on the same portion of the sensing element, with the same direction of sensitivity. Each of these elements is then connected in the bridge arrangement shown in FIG. 9. The benefit of this arrangement is it shows improved temperature matching characteristics. When the magnet moves in the z direction, the method of operation is essentially the same as described above in connection with FIGS. 2 and 3, with movement in the z direction causing a corresponding change in the outputs of the bridge circuit. As with FIGS. 2 and 3, any movement of the magnet in the x-y plane will be compensated for by pairs of sensing elements on opposing sides of the sensor having a sensitivity that is aligned and in the same direction. For example, each of the sensing element pairs R1a and R4b, R1b and R4a, R2a and R3b, and R2b and R3a, will compensate for displacement within the x-y plane.

Figure 10:
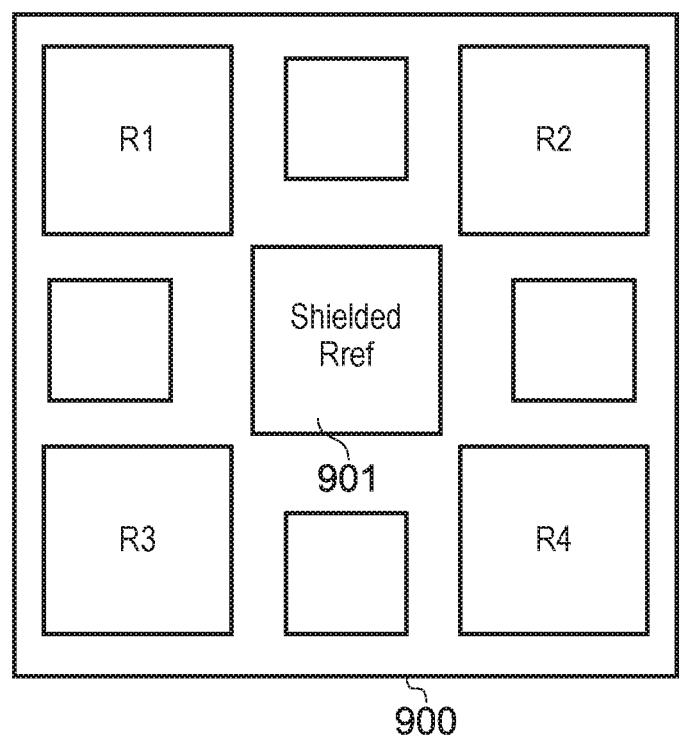
FIG. 10 is a plan view of a sensing element in accordance with a further embodiment of the disclosure.
Figure 11:
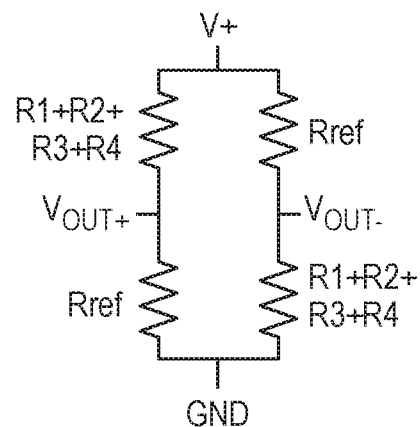
FIG. 11 is a bridge circuit in accordance with a further embodiment of the disclosure.

FIG. 10 shows a sensing element 900 in accordance with a further embodiment of the disclosure. In this embodiment, in addition to the magnetoresistive elements R1 to R4, a shielded reference resistor 901 is included at the centre of the sensing element 900. In this embodiment, the magnetoresistive elements are GMR multilayer elements. FIG. 11 shows a bridge arrangement which is used with the arrangement shown in FIG. 10. R1 to R4 may be coupled in a series or parallel arrangement. The total resistance of the series or parallel arrangement of R1 to R4 should equal or approximately equal the resistance of the reference resistor 901. Each respective pair of elements, R1 and R4, and R2 and R3, compensates for movement in the x-y plane in substantially the same way as the previous examples. As an alternative, R1 to R4 may be each formed from two identical magnetoresistive elements R1a, R1b, R2a, R2b, R3a, R3b, R4a, and R4b. In such case, the top-left hand resistor of FIG. 11 may be formed from R1a to R4a, and the bottom right may be formed from R1b to R4b. As a further alternative, the top-left hand resistor may be formed from R1 and R2, whereas the bottom-right hand resistor may be formed from R3 and R4.

Figure 12:
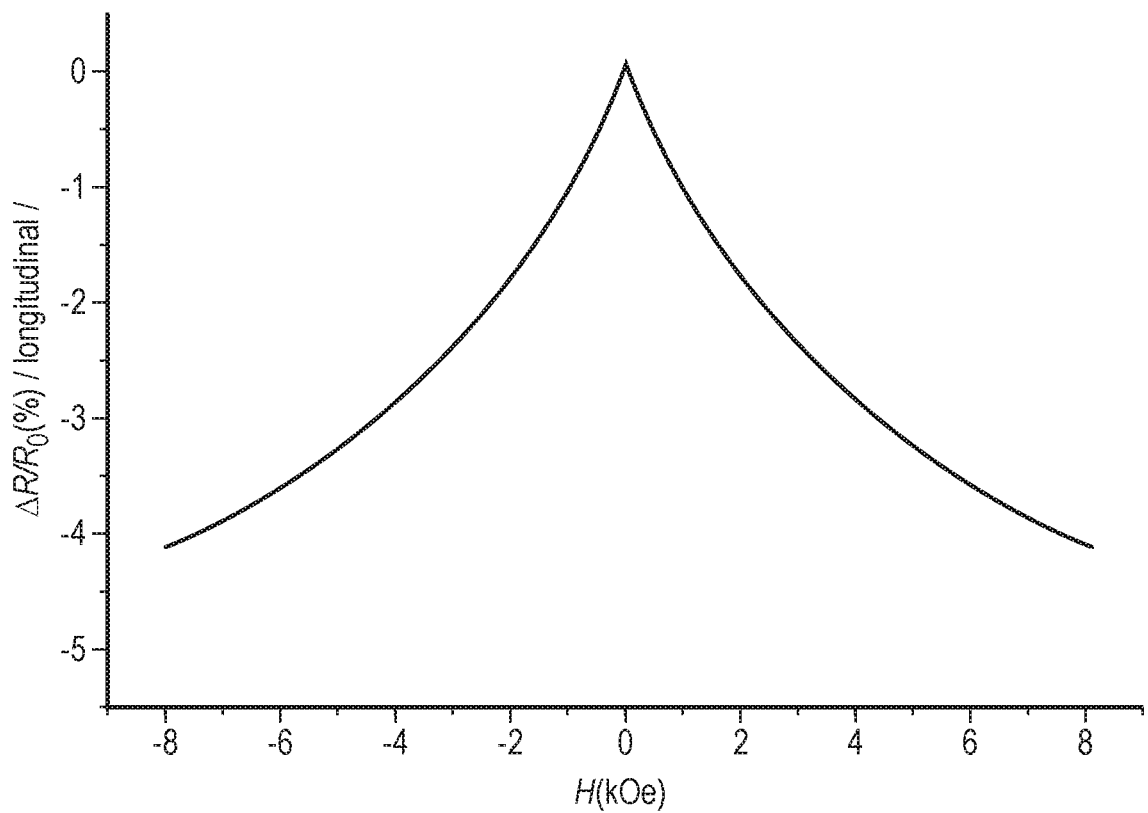
FIG. 12 is a chart showing a typical transfer curve of a GMR multilayer in accordance with an embodiment of the disclosure.

FIG. 12 is a chart showing a typical transfer curve of a GMR multilayer in accordance with an embodiment of the disclosure. In this example, the chart shows the general relationship between the GMR resistance and the magnetic field strength for a resistor disclosed herein. The changes in resistance are independent of the magnetic field direction.

FIGS. 13A to 13D show a simulation of the individual field strength measurements of resistors R1 to R4 in a further embodiment. In this embodiment, the magnetoresistive elements are arranged at the centres of the edges, rather than in the corners, in a similar manner to the arrangement shown in FIG. 6A. FIG. 14 shows a simulation of the output of the bridge arrangement shown in FIG. 11, using the magnetoresistive arrangement used for FIGS. 13A to 13D. As can be seen, this arrangement shows further improvements over the embodiments described above, with little to no difference in the outputs resulting from movement in the x-y plane.

Figure 13A:
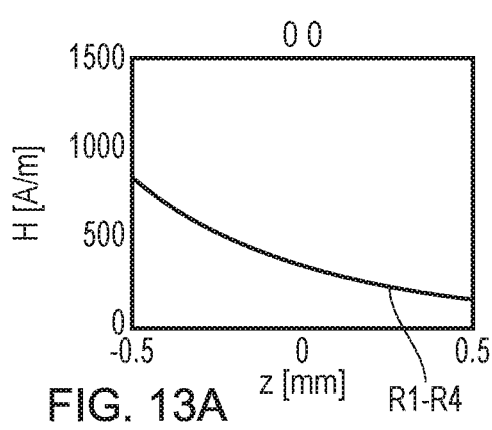
FIGS. 13A to 13D are charts showing magnetic field at each element of the sensing element of FIG. 10.
Figure 13B:
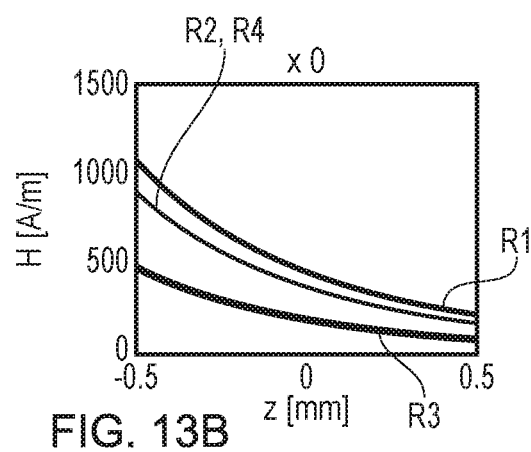
Figure 13C:
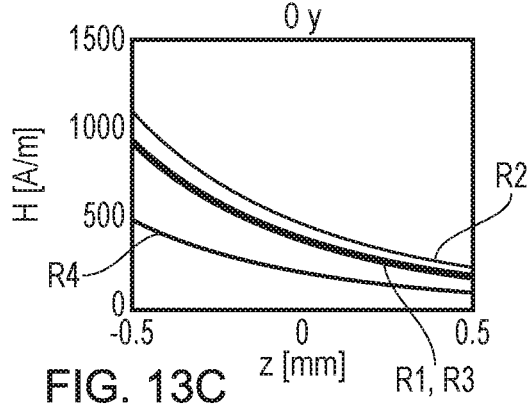
Figure 13D:
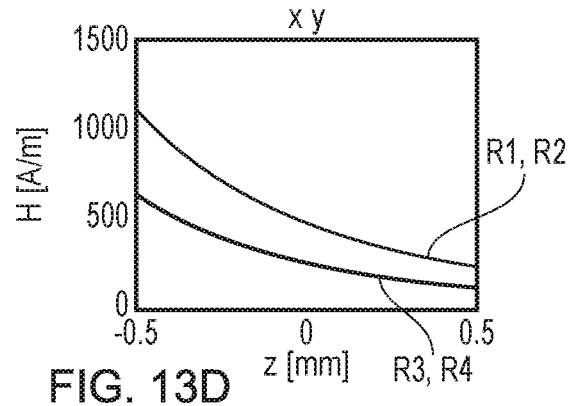
Figure 14:
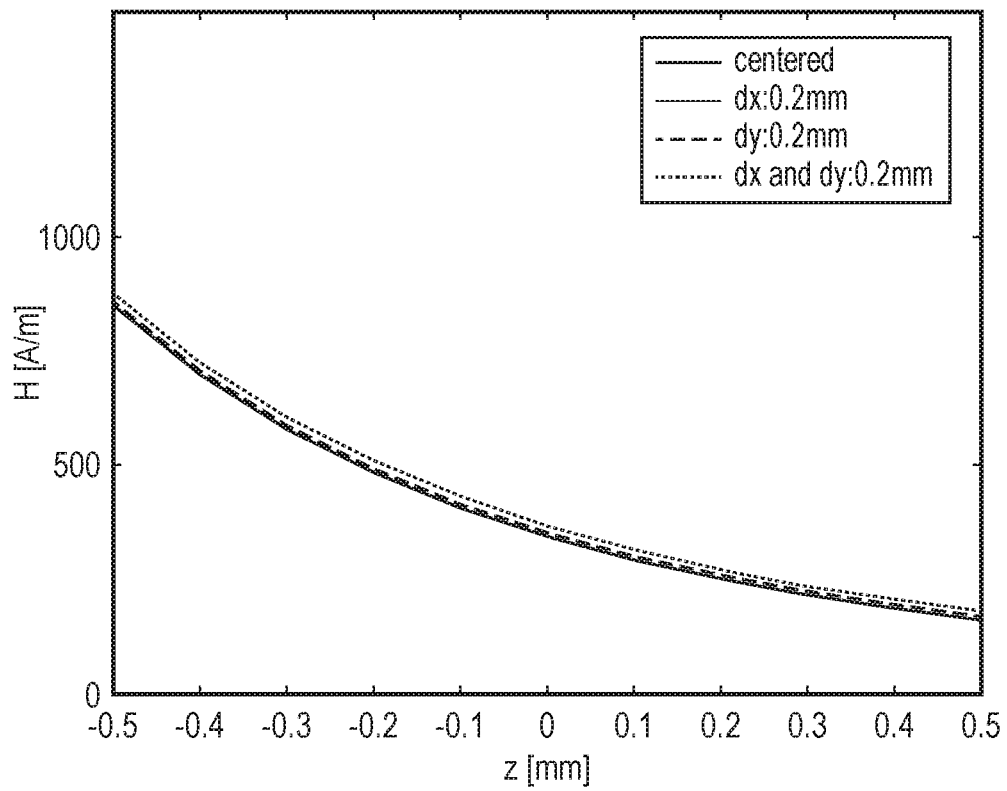
FIG. 14 is a chart showing the overall magnetic field strength against movement of the magnet in the z-direction for the sensing element of FIG. 10.

FIG. 13A shows the changes in magnetic field strength of all four resistors R1-R4 as the magnet is displaced in the z-direction when the magnet is centred above the sensor, that is to say, there is no displacement in the x and y directions. Here, the magnetic field strength at all four resistors is the same. FIGS. 13B, 13C and 13D show the changes in magnetic field strength due to displacement in the z-direction, when the magnet is also displaced laterally away from its centre position. In FIG. 13B, the magnet is displaced in the x direction, with resistors R1 and R3 experiencing a corresponding change in magnetic field strength and thus resistance, thereby compensating for this lateral movement. In FIG. 13C, the magnet is displaced in the y direction, with resistors R2 and R4 experiencing a corresponding change in magnetic field strength and thus resistance, thereby compensating for this lateral movement. In FIG. 13D, the magnet is displaced in both the x and y directions, with each pair again experiencing a corresponding change in magnetic field strength and thus resistance, thereby accounting for the lateral movement in both directions.

The present disclosure is suitable for use in a number of applications in which detection of movement of a magnet in one direction may be interfered by movement in other directions. Example applications include, drive motors in digital cameras, drive motors in microscopes, and proximity detectors.

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined by reference to the appended claims.

What is claimed is:

1. A magnetoresistive position sensor for measuring position in at least a first direction, the sensor comprising:
a magnet arranged to move in at least the first direction; and
a differential field sensor arranged to detect movement of the magnet in the first direction, and to compensate for movement of the magnet in at least a second direction, wherein the differential field sensor comprises a plurality of magnetoresistive elements each having a respective sensing direction, the sensing directions of each of the plurality of magnetoresistive elements are arranged in a plane, the plane being substantially perpendicular to the first direction, and a first pair of magnetoresistive elements of the plurality of magnetoresistive elements are arranged such that the sensing directions of the magnetoresistive elements of the first pair are in a substantially same direction in the plane.

2. A sensor according to claim 1, wherein the differential field sensor is arranged to detect a change in magnetic field strength generated by the movement of the magnet in the first direction.

3. A sensor according to claim 1, wherein the at least a second direction is in the first plane.

4. A sensor according to claim 1, wherein a second pair of magnetoresistive elements of the plurality magnetoresistive elements are arranged such that the sensing directions of the magnetoresistive elements of the second pair are aligned, and offset with respect to the sensing directions of the first pair of the magnetoresistive elements.

5. A sensor according to claim 4, wherein the sensing directions of the first pair of the magnetoresistive elements is substantially perpendicular to the sensing directions of the second pair of the magnetoresistive elements.

6. A sensor according to claim 1, wherein the plurality of magnetoresistive elements are connected in a bridge arrangement, and an output of the bridge arrangement is indicative of movement of the magnet in the first direction.

7. A sensor according to claim 6, wherein the bridge arrangement is a Wheatstone bridge circuit.

8. A sensor according to claim 6, wherein the at least a second direction is in a first plane, the first plane being substantially perpendicular to the first direction, and wherein the output of the bridge arrangement is not indicative of movement of the magnet in the first plane.

9. A sensor according to claim 1, wherein one of the plurality of magnetoresistive elements is arranged as a reference resistance.

10. A sensor according to claim 9, wherein the reference resistor is shielded, such that its output is not magnetic-field dependent.

11. A magnetoresistive position sensor for measuring position in at least a first direction, the sensor comprising:
a magnet arranged to move in at least the first direction; and
a differential field sensor arranged to detect movement of the magnet in the first direction, and to compensate for movement of the magnet in at least a second direction, wherein the differential field sensor comprises a plurality of magnetoresistive elements each having a respective sensing direction, the sensing directions of each of the plurality of magnetoresistive elements are arranged in a plane that is offset with respect to the first direction, the plurality of magnetoresistive elements being connected in a Wheatstone bridge circuit; and
wherein a first pair of magnetoresistive elements of the plurality of magnetoresistive elements are arranged such that the sensing directions of the magnetoresistive elements of the first pair are in a substantially same direction in the plane, the first pair of magnetoresistive elements is connected in series between a first node and a second node, and a second pair of magnetoresistive elements of the plurality of magnetoresistive elements is connected in series between the first node and the second node, and an output of the Wheatstone bridge circuit is taken from a respective node between each of the first and second pairs.

12. A sensor according to claim 11, wherein the second pair of the magnetoresistive elements are arranged such that their sensing directions are aligned, wherein the sensing directions of the second pair of magnetoresistive elements are offset with respect to the sensing directions of the first pair of the magnetoresistive elements.

13. A sensor according to claim 12, wherein the sensing directions of the first pair of the magnetoresistive elements are substantially perpendicular to the sensing directions of the second pair of the magnetoresistive elements.

14. A method for measuring position, in at least a first direction, using a differential field sensor, the method comprising:
detecting a position of a magnet, in the first direction, using the differential field sensor, wherein the differential magnetic field sensor comprises a first pair of sensing elements and a second pair of sensing elements, and wherein the first pair of sensing elements and the second pair of sensing elements are positioned on a same substrate; and
compensating for movement of the magnet in at least a second direction, based on the differential field sensor detecting a change in magnetic field strength generated by the magnet as the magnet moves in the second direction, and
wherein the second direction is in a first plane, the first plane being substantially perpendicular to the first direction.

15. A method according to claim 14, wherein the first pair of sensing elements is connected in series between a first node and a second node, and the second pair of sensing elements is connected in series between the first node and the second node, and an output is taken from respective nodes between each of the first and second pairs of sensing elements.

16. A magnetoresistive position sensor for measuring position in at least a first direction, the magnetoresistive position sensor comprising:
a magnet arranged to move in at least the first direction; and
a substrate having a plurality of magnetoresistive elements arranged thereon, the magnetoresistive elements arranged to detect movement of the magnet in the first direction;
wherein the magnetoresistive elements comprise four magnetoresistive elements arranged in a bridge arrangement to compensate for movement of the magnet in at least a second direction, wherein each of the four magnetoresistive elements has a respective sensing direction in a plane, and wherein the plane is substantially perpendicular to the first direction.

17. A magnetoresistive position sensor according to claim 16, wherein the four magnetoresistive elements comprise a pair of magnetoresistive elements having respective sensing directions aligned with each other.

18. A magnetoresistive position sensor according to claim 17, wherein the four magnetoresistive elements comprise a second pair of magnetoresistive elements having respective sensing directions aligned with each other and substantially perpendicular to the sensing directions of the magnetoresistive elements of the pair.

19. A magnetoresistive position sensor according to claim 16, wherein the magnetoresistive elements are arranged to detect movement of the magnet in the first direction by detecting a change in magnetic field strength generated by movement of the magnet in the first direction.

* * * * *